United States Patent
Hamada et al.

(10) Patent No.: US 10,163,995 B2
(45) Date of Patent: Dec. 25, 2018

(54) DISPLAY DEVICE WITH PROJECTION STRUCTURES ON A BANK

(71) Applicant: Japan Display Inc., Minato-ku (JP)

(72) Inventors: Yuki Hamada, Minato-ku (JP); Hajime Akimoto, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/677,221

(22) Filed: Aug. 15, 2017

(65) Prior Publication Data

US 2018/0090549 A1    Mar. 29, 2018

(30) Foreign Application Priority Data

Sep. 23, 2016 (JP) .................................. 2016-185277

(51) Int. Cl.
*H01L 27/32* (2006.01)
*H01L 51/52* (2006.01)
*H01L 51/00* (2006.01)

(52) U.S. Cl.
CPC ........ *H01L 27/3246* (2013.01); *H01L 27/322* (2013.01); *H01L 27/3211* (2013.01); *H01L 27/3258* (2013.01); *H01L 51/0011* (2013.01); *H01L 51/5203* (2013.01)

(58) Field of Classification Search
CPC ............. H01L 27/3246; H01L 51/5203; H01L 27/3258; H01L 27/322; H01L 51/5246; H01L 51/525; H01L 51/5253; H01L 51/56; H01L 2251/5315; H01L 2251/558
See application file for complete search history.

(56) References Cited

U.S. PATENT DOCUMENTS

| 2002/0180371 A1* | 12/2002 | Yamazaki | ........... H01L 27/3246 315/169.3 |
| 2014/0117336 A1* | 5/2014 | Kim | .................... H01L 51/5246 257/40 |
| 2015/0090991 A1 | 4/2015 | Ishii et al. | |

FOREIGN PATENT DOCUMENTS

JP    2015-69861    4/2015

* cited by examiner

*Primary Examiner* — Selim Ahmed
(74) *Attorney, Agent, or Firm* — Oblon, McClelland, Maier & Neustadt, L.L.P.

(57) ABSTRACT

The purpose of the present invention is to precisely determine an area of the evaporated organic EL material in an organic EL display device, where organic EL layers in individual pixels emit light of different wave lengths. The purpose is realized by a structure that: A display device comprising: pixel electrodes are formed in a matrix arrangement on a substrate and a space exists between the pixel electrodes, a bank, which covers an edge of the pixel electrode, having an opening that exposes a part of one of the pixel electrodes, a first projection formed on a top of the bank and along a side of the opening, a second projection formed in an area that is near to the center of the top of the bank than the first projection is, in a plan view.

16 Claims, 14 Drawing Sheets

DISPLAY DEVICE WITH PROJECTION STRUCTURES ON A BANK

CLAIM OF PRIORITY

The present application claims priority from Japanese Patent Application JP 2016-185277 filed on Sep. 23, 2016, the content of which is hereby incorporated by reference into this application.

BACKGROUND OF THE INVENTION

(1) Field of the Invention

The present invention relates to an organic EL display device where each pixel emits light of different wavelengths.

(2) Description of the Related Art

Since an organic EL display device is a self illuminous display device, high contrast and vivid images can be realized. In addition, unlike a liquid crystal display device, an organic EL display doesn't need a back light, consequently, a thinner display can be realized than a liquid crystal display device. Further a flexible display device can be realized by making the substrate thin.

There are two types in organic EL display devices. One type is to form a white light emitting organic EL layer in all the pixels and color filters are formed on the counter substrate corresponding to individual pixels. Another type is to form an organic EL layer in individual pixels that emits light of different wavelengths.

In the first type, namely, forming color images by forming a white light emitting organic EL layer in all the pixels and color filters are formed on the counter substrate corresponding to individual pixels, it is necessary to set the distance between the organic EL layer and the color filter precisely. In addition, an adhesive is necessary to attach the counter substrate having color filters to the substrate having organic EL layers.

Japanese patent laid open 2015-69861 discloses an organic EL display device to form a spacer between the pixels to set the distance between the substrate where organic EL layers are formed and the substrate where color filters are formed. Japanese patent laid open 2015-69861 also discloses to make a plan view of the spacer as cone like or stream line like, thus, a fluidity of the adhesive is maintained.

SUMMARY OF THE INVENTION

An organic EL display device having an organic EL layer in individual pixels that emits light of different wavelengths has various advantages as that: color filters are not necessary; a counter substrate for color filters are not necessary; processes for alignment between color filters and organic EL layers of individual pixels are not necessary; a color mixture caused by misalignment between the color filters and the pixels doesn't occur.

In addition, a color filter transmits light of certain wavelengths and absorbs light of other wave lengths; therefore, using color filters means a decrease of brightness of the screen or an increase of power consumption. An organic EL display that an individual pixel emits light of different wave lengths has advantages of an increase of brightness of the screen and a decrease of power consumption.

However, different organic EL layers must be deposited in individual pixels by e.g. vacuum evaporation in an organic EL display device where individual pixels emit light of different wave lengths. Openings are made in an evaporation mask corresponding to the pixels of the organic EL display device, consequently, the pitch of the openings of the evaporation mask corresponds to the pitch of the pixels. The pixel pitch becomes less than 40 μm in a high definition display like 300 ppi, thus, openings of the evaporation mask must be made in such a tiny pitch.

On the other hand, if the evaporation mask contacts a substrate where TFTs and organic EL layers are formed (herein after called TFT substrate; TFT substrate may be called array substrate), the organic EL layers may be destroyed; thus, there must be certain distance between the evaporation mask and the TFT substrate. However, in this structure, evaporation material may intrude in the gap between the evaporation mask and the TFT substrate. This phenomenon is called an intrusion in this specification. If the intrusion is severe, the material is deposited in an adjacent pixel, then, the color purity is deteriorated.

In an organic EL display device where individual pixels have different organic EL materials and emit different color of light, the purpose of the present invention is to suppress the intrusion of organic EL material into other pixels, thus, to realize an organic EL display device of superior light emitting efficiency.

The present invention solves the above problem. Concrete measures are as follows:

(1) A display device comprising: pixel electrodes are formed in a matrix arrangement on a substrate and a space exists between the pixel electrodes, a bank, which covers an edge of the pixel electrode, having an opening that exposes a part of one of the pixel electrodes, a first projection formed on a top of the bank and along a side of the opening, a second projection formed in an area that is near to the center of the top of the bank than the first projection is, in a plan view.

(2) A display device comprising: pixel electrodes are formed in a matrix arrangement on a substrate and a space exists between the pixel electrodes, a bank, which covers an edge of the pixel electrode, having an opening that exposes a part of one of the pixel electrodes, a first projection formed on a top of the bank and along a side of the opening, wherein two of the first projections are formed between one of the pixel electrodes and adjacently located another of the pixel electrodes.

DETAILED DESCRIPTION OF THE PREFERRED EMBODIMENTS

The present invention will be described in detail referring to the following embodiments.

First Embodiment

Figure 1:
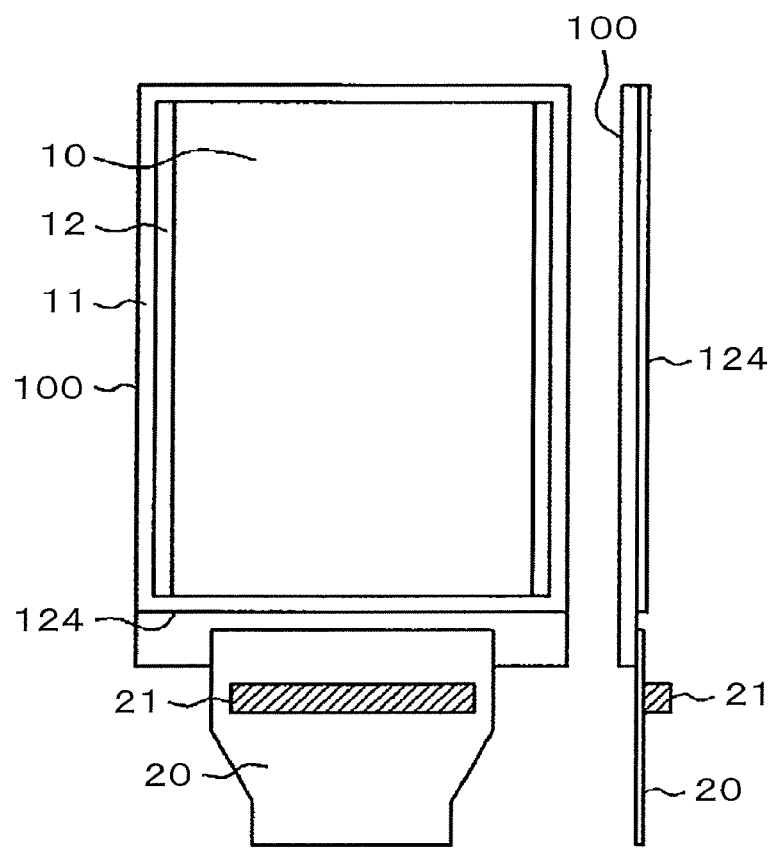
FIG. 1 is a plan view and a side view of an organic EL display device.

FIG. 1 includes a plan view and a side view of an organic EL display device. Left hand side of FIG. 1 is a plan view and right hand side of FIG. 1 is a side view. In a plan view of FIG. 1, the display area 10 where pixels are formed in matrix arrangement and the frame area 11 are formed around the display area in the TFT substrate 100.

In FIG. 1, the scanning line driving circuit 12 is formed in the frame area 12. The scanning line driving circuit 12 is formed along a side of the display area. The scanning line driving circuit 12 may be formed at both sides of the display area or may be formed at one side of the display area. The scanning line driving circuit 12, which uses driving TFTs, is built in on the TFT substrate 100. An organic EL layer is formed in each of the pixels; each of the pixels emits light of different wave length. Since organic EL layer is weak against moisture, thus, it must be protected from external environment. For that purpose, the protective layer 124 is formed. The protective layer is formed by an inorganic protective layer and an organic protective layer. In addition, sometimes a counter substrate is adhered to secure the protection.

There is an area where the protective layer doesn't exist at one side of the TFT substrate 100; terminals are formed in this area. The flexible wiring substrate 20, where the driver IC 21 is installed, connects to the terminal. Power, video signals, scanning signals, clock signals are supplied to the organic EL display device through the flexible wiring substrate 20.

Figure 2:
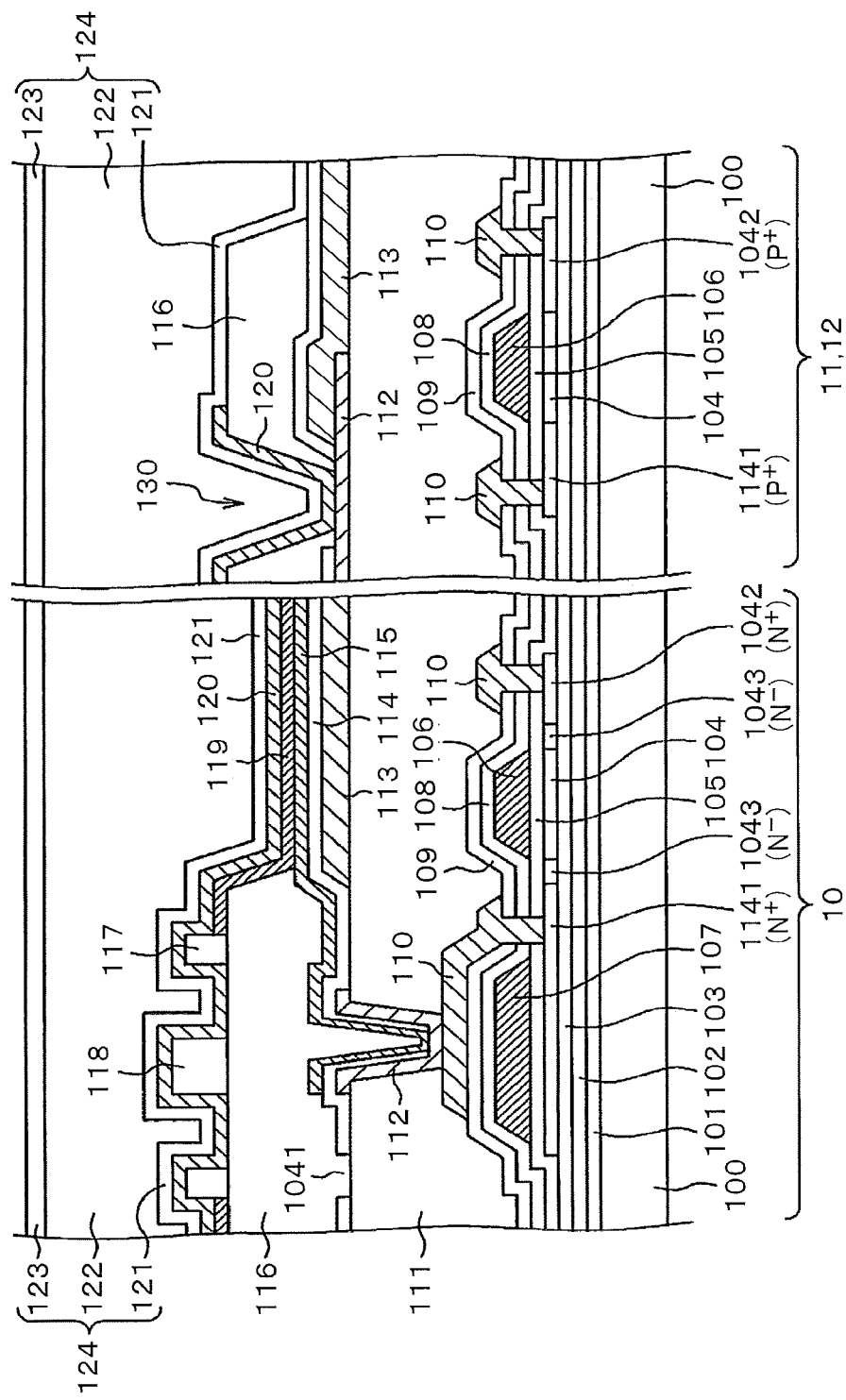
FIG. 2 is a cross sectional views of a display area and a frame area.

FIG. 2 is cross sectional views of the display area and the scanning line driving circuit. The left hand side of FIG. 2 is a cross sectional view of the display area 10 and the right hand side of FIG. 2 is a cross sectional view of the scanning line driving circuit 12. The present invention specifically concerns a structure of the display area 10 shown at the left hand side of FIG. 2. In FIG. 2, the TFT substrate 100 is formed by glass or resin. Glass can be flexibly bent if it becomes as thin as 0.2 mm or less.

The display device can be further flexible when the substrate is formed by resin. Polyimide is specifically suitable for the substrate because of its heat resistance and its mechanical strength. Since polyimide can be made as thin as 5-20 μm, a very thin display device can be realized. A manufacturing method of the TFT of polyimide is as follows:

At the outset, polyamic acid, which is material of polyimide, is coated on the glass substrate, then imidized; consequently, the TFT substrate 100 of 5-20 μm thickness by polyimide is formed. TFTs, organic EL layers, insulating layers, wirings, protective layers are formed on the TFT substrate 100; after that, the glass substrate is removed from the polyimide substrate 100 by laser ablation, namely, a laser is irradiated at an interface between the glass substrate and the polyimide substrate. Other resin than polyimide can also be applicable to the TFT substrate 100.

Undercoats of three layers are formed on the TFT substrate 100. The first undercoat 101 is formed by silicon oxide (SiO, SiOx is represented by SiO in this specification). The reason is that SiO has a good adhering strength with the TFT substrate 100. The second undercoat is formed by silicon nitride (SiN, SiNx is represented by SiN in this specification). The second undercoat blocks moisture or other impurities that come from outside. The third undercoat 103 is formed by SiO on the second undercoat 102. The third undercoat 103 blocks moisture or impurities, which is contained in the second undercoat 102. By the way, the undercoat of FIG. 2 is an example. The undercoat can be a mono layer, two layers or three layers according to necessity of display devices. Further, the undercoat can include a layer of aluminum oxide (AlO, AlOx is represented by AlO in this specification).

A TFT is formed on the third undercoat 103. In FIG. 2, the TFT in the display area 10 is a N channel TFT and the TFT in the scanning line driving circuit 12 is a P channel TFT; however, types of the TFTs are not limited in the above combination. TFTs in both of the display area 10 and the scanning driving circuit 12 can be formed by the same channel type or can be a CMOS type, which uses both of the N channel and the P channel. In FIG. 2, at the outset, a-Si (amorphous silicon) is formed, then, excimer laser is applied to the a-Si to transform the a-Si to the Poly-Si (Poly Silicon). After patterning the Poly-Si, the semiconductor layer 104 is formed.

The gate insulating film 105 is formed by SiO on the semiconductor layer 104. The gate electrode 106 is formed on the gate insulating film 105 at a position corresponding to the channel region of the TFT. The gate electrode 106 is formed e.g. by a laminated film of an Al layer and a Ti layer. The drain 1041 and the source 1042 are formed in the semiconductor layer 104 by the ion implantation using the gate electrode 106 as a mask. In the display area, the source 1042 and the drain 1041 are made N type by doping e.g. Phosphor (P), while, in the scanning driving circuit, the source 1042 and the drain 1041 are made P type by doping e.g. Boron (B). The LDD (Light Doped Drain) is formed in the semiconductor layer 104 in the display area using a photo resist pattern for the gate electrode 106 as a mask. The purpose of the LDD is to prevent a break down by a high electrical field formed in the drain 1041 or in the source 1042.

In FIG. 2, the storage capacitance line 107 is formed by the same material as the gate electrode 106 and on the same layer as the gate electrode 106. The storage capacitance line 107 is also used for forming a storage capacitance with the semiconductor layer that is transformed to be conductive. The gate electrode 106 and the storage capacitance line 107 are called as a first wiring. The first interlayer insulating film 108 is formed by SiN on the gate electrode 106 and the storage capacitance line 107. The second interlayer insulting film 109 is formed on the first inter layer insulating film 108. The second wiring layer 110 is formed by a laminated film of Ti—Al—Ti on the second insulating film 109. The second wiring layer connects with the drain 1041 of the TFT via the through hole formed in the first interlayer insulating film 108 and the second interlayer insulating film 109.

The organic passivation film 111 is formed covering the TFT and the second wiring layer 110. The organic passivation film 111 is formed as thick as 2-3 μm because the organic passivation film 111 works also as a flattening film. The organic passivation film 111 is formed by a photo sensitive resin like e.g. acrylic. By using the photo sensitive resin, the organic passivation film 111 can be patterned without a photo resist.

The organic passivation film (the flattening film) 111 is removed at the through holes and at the peripheral area. In FIG. 2, the area where the organic passivation layer 111 is removed is covered by the first ITO (Indium Tin Oxide). Further, on the same layer as the first ITO, the third wiring layer 113 is formed by a laminated film of Ti—Al—Ti on the organic passivation film 111. The third wiring layer is used for a formation of capacitance in a pixel or for wiring in the peripheral area. The first ITO 111 formed in the through holes of the organic passivation film 111 protects the second wiring layer 110 from the etching solution for the patterning of the third wiring layer 113.

The second ITO 112 and the third wiring layer 113 are covered by the capacitive insulating film 114. The capacitive insulating film 114, however, is opened in the through hole of the organic passivation film for a connection of the lower electrode 115 and the second wiring layer that connects with the drain 1041 of the TFT. The lower electrode 115 is a laminated film that a metal, e.g. Ag, is sandwiched by ITO. The lower ITO layer improves adhering with the organic passivation film 111. The metal layer, e.g. Ag, works as a reflective electrode. The upper ITO layer works as an anode for the organic EL layer 119. The lower electrode 115 is sometimes called as a pixel electrode.

The bank 116 is formed to cover the capacitive insulating film 114 and the lower electrode 115. The bank 116, which is also called a rib, is formed between pixels to isolate the individual pixel. A disconnection of the organic EL layer 119 tends to occur at and edge of the lower electrode 115 because of the step formed by the lower electrode 115. The bank prevents the disconnection of the organic EL layer 119 by forming the organic EL layer 119 in the emitting area, which is formed in a hole surrounded by the bank 116. A small taper of the bank 115 is preferable to prevent the disconnection of the organic EL layer 119. The bank 116 is formed as that: forming e.g. acrylic on the whole surface of the display area in about 2 μm thickness, and patterning the layer to make a hole. The organic EL layer is formed in the hole. The hole is also called as the emitting area. The patterning of the bank can be made simple by using a photo sensitive resin as a material.

In the meantime, the capacitive insulating film 116 has an opening 141 at a region covered by the bank. The opening 141 discharges moisture or other gasses from the organic passivation film 111 to the outside through the bank 116 during a baking process after the bank 116 is formed.

In the light emitting area in FIG. 2, the organic EL layer 119 is formed on the lower electrode 115. The organic EL layer 119 extends to a side wall and a part of the top of the bank 116. The organic EL layer consists of plural layers, which will be explained with FIG. 3. The feature of the present invention as shown in FIG. 2 is that a first barrier wall 117 and a second barrier wall 118 are formed on the top of the bank 116, thus, confining an area of the evaporated material. Herein after, the first barrier wall 117 is called the first projection 117 and the second barrier wall 118 is called the second projection 118. The first projection and the second projection are explained with FIG. 3 in detail.

In FIG. 2, the upper electrode 120 is formed covering the organic EL layer, the first projection 117 and the second projection 118. The upper layer, which constitutes cathode, is formed by a transparent oxide conductor like IZO (Indium Zinc Oxide) or thin film of alloy like MgAg or thin film of metal. The cathode 120, formed on all over the display region, contacts with a cathode line, which is formed by the third wring layer, via through holes formed in the bank 116 in the frame area.

In FIG. 2, the protective layer 124 is formed on the upper electrode (cathode) 120. The protective layer 124 is formed by a laminated three layers of the first inorganic protective layer 121, which directly covers the cathode 120, the organic protective layer 122 and the second inorganic protective layer 123. The first inorganic protective layer, formed by SiO or SiN, protects the organic EL layer 119 from e.g. moisture. The organic protective layer 122, formed by e.g. acrylic, mechanically protects the organic EL layer 119. For that purpose, the organic protective layer 122 is made thick as e.g. 5 μm or more. The second inorganic protective layer, formed by SiO or SiN, covers the organic protective layer 122, and prevents e.g. moisture from intruding into the organic protective layer 122. In some products, a counter substrate or a substrate for a touch panel may be attached on the second inorganic protective layer 123.

Figure 3:
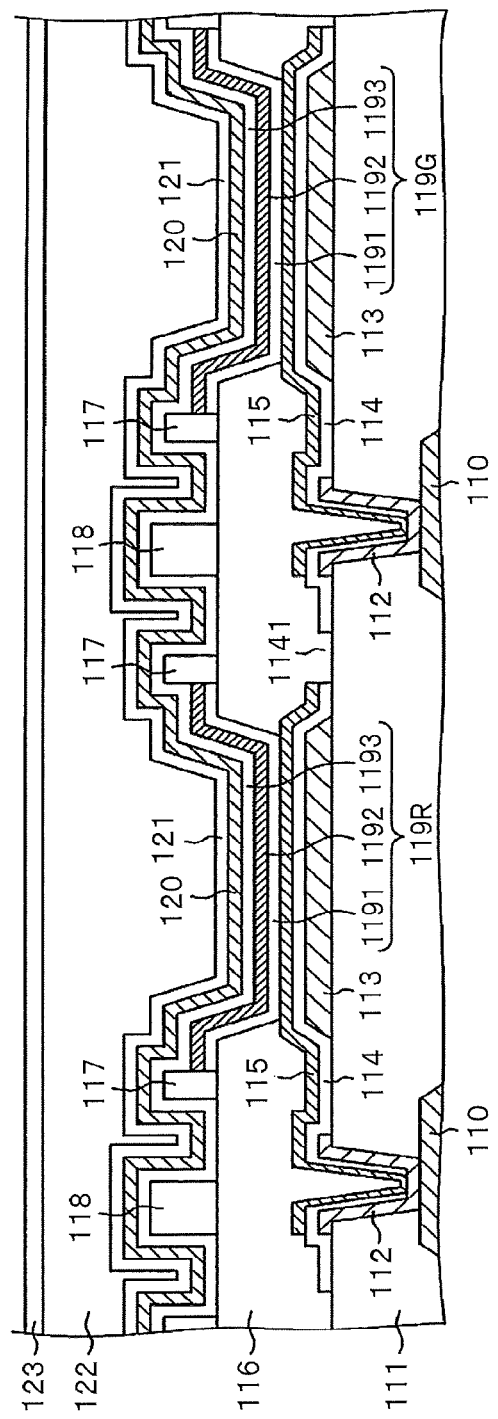
FIG. 3 is a detailed cross sectional view in vicinity of the bank of the present invention.

FIG. 3, which presents a feature of the present invention, is a cross sectional view near the bank 116 that shows the structure of the organic EL layer 119, the first projection 117 and the second projection 118. In FIG. 3, two first projections 117 and one second projection 118 are formed on the top of the bank 116. The second projection 118 is set between the two first projections 117. Plan views of the first projection and the second projection are explained later. In FIG. 3, in the light emitting area, the organic EL layer is formed on the under electrode 115. The organic EL layer includes, from the side of the lower electrode, a hole injection layer, a hole transport layer, an light emitting layer, an electron transport layer and an electron injection layer. Those layers are formed by vacuum evaporation.

Among them, the hole injection layer and the hole transport layer 1191 and the light emitting layer 1192 are separated by the first projection 117 for individual pixels, and the electron transport layer and the electron injection layer 1193 are formed in common in all the pixels. In other words, the electron transport layer and the electron injection layer 1193 are formed in common in all over the display area. The structure above the upper electrode 120 is already explained with FIG. 2. By the way, the hole injection layer and the hole transport layer 1191 can be formed in common in all the pixels in the display area; in FIG. 3, however, the hole injection layer and the hole transport layer 1191 are formed in separate for individual pixels limited by the first projections 117.

In FIG. 3, it is necessary to form the light emitting layer 1192 independently in an individual pixel because this invention is applied to an organic EL display device that each of pixels emits light of different wave lengths as red, green and blue. In this type, however, the evaporation mask for the light emitting layer cannot contacts the substrate; thus, there must be a gap between the mask and the substrate, more precisely, between the bank 116 and evaporating mask. On the other hand, if the evaporating material intrudes to another pixel through the gap, the light emitting characteristics in the pixel are deteriorated, more concretely, color purity in the pixel is deteriorated.

Figure 4:
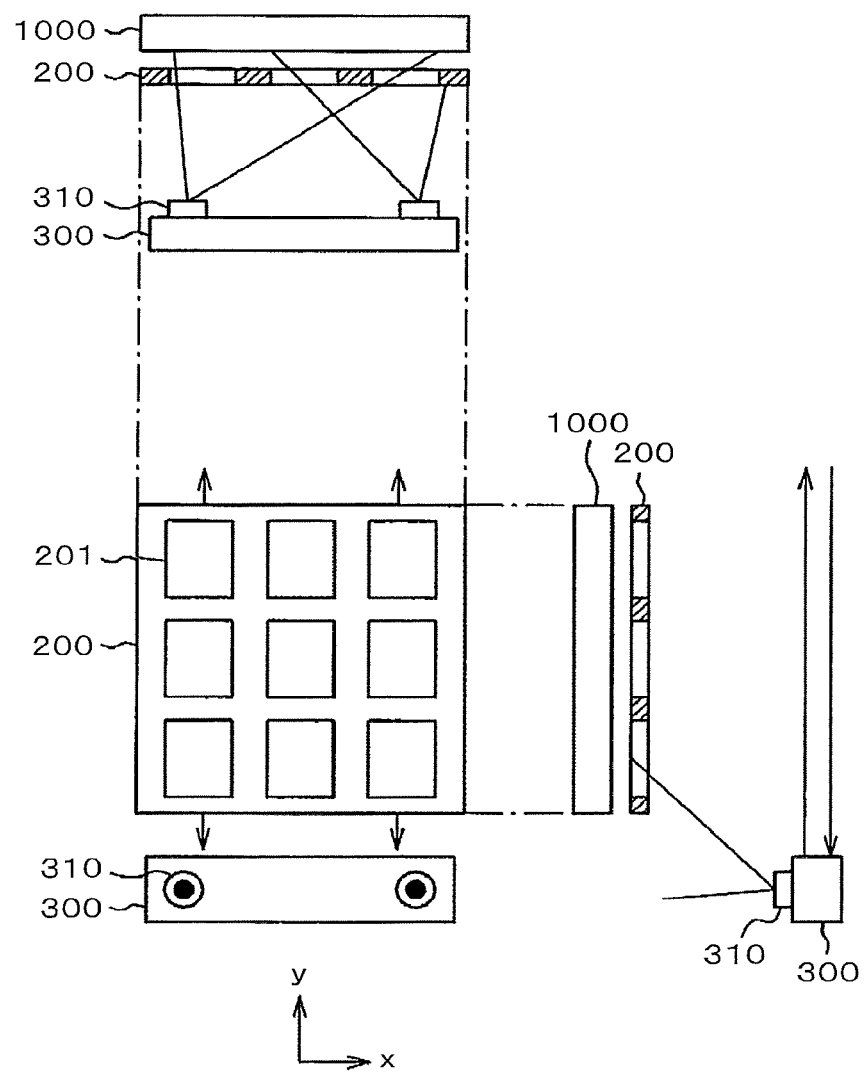
FIG. 4 is a conceptual diagram of the vacuum evaporation apparatus for the present invention.

FIG. 4 is a conceptual diagram of the vacuum evaporation apparatus for explanation of the above described problem. The upper figure of FIG. 4 is a cross sectional view of the vacuum evaporation apparatus. In the upper figure of FIG. 4, the evaporation mask 200 is set below the mother substrate 1000 with a certain gap. By the way, for manufacturing efficiency, plural organic EL display devices are formed in the mother substrate 1000 and separated from the mother substrate 1000 after the organic EL display devices are completed. The two evaporation sources 310 are set under the evaporation mask 200. There are organic materials for the organic EL layers in the evaporation sources 310. In the upper figure of FIG. 4, the evaporation sources 310 move in a direction perpendicular to the paper surface during the vacuum evaporation.

In FIG. 4, the two evaporation sources 310 are used for a uniform thickness of evaporated layer; however, as depicted at the upper figure of FIG. 4, when considered at a certain position of the substrate 1000, evaporating material from a remote evaporation source 310 intrudes in a gap between the substrate and the evaporation mask, which is a phenomenon of a intrusion.

The lower figure of FIG. 4 includes a plan view and a cross sectional view of the vacuum evaporation apparatus. In the lower figure of FIG. 4, the evaporation mask has a cell 201, which corresponds to an organic EL display device in the mother substrate. The evaporation source unit 300 moves in y direction, thus, the evaporated layers can be formed all over the big mother substrate 1000. The arrows in FIG. 4 show directions that the evaporation source unit 300 moves. By the way, there is no problem of intrusion in y direction since the evaporation sources 310 moves in y direction. In x direction, however, the intrusion of evaporation material occurs among pixels of the substrate 1000 due to a gap between the mother substrate 1000 and the evaporation mask 200 because there are only two evaporation sources 310 in x direction in the apparatus.

Figure 5:
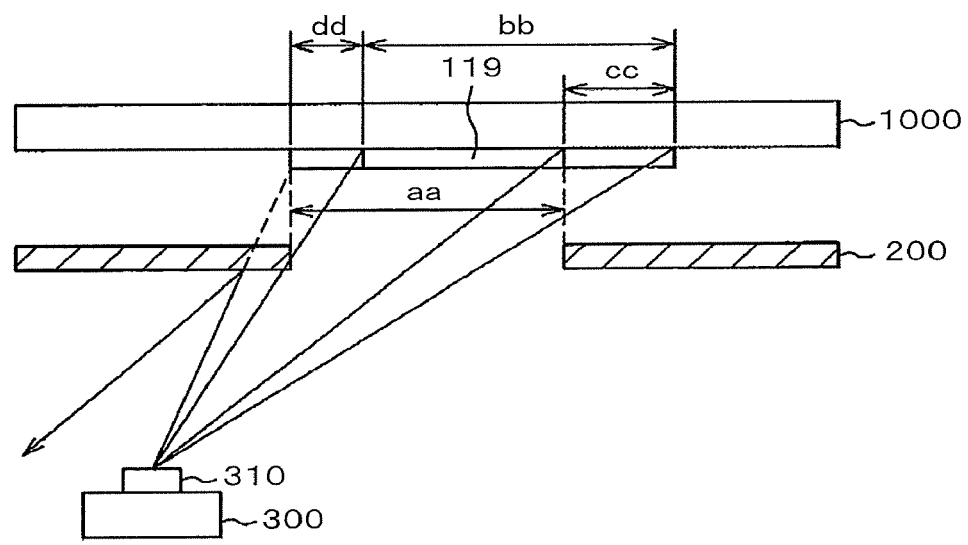
FIG. 5 is a cross sectional view showing a problem in the vacuum evaporation process.

FIG. 5 is a cross sectional view that shows the above explained phenomenon. In FIG. 5, the organic EL material is deposited on the mother substrate 1000 in oblique direction through the opening of the mask 200. In FIG. 5, the area aa, which corresponds to an opening of the mask 200, is a designed evaporation area. On the other hand the area bb is an actual evaporation area because the evaporation material is deposited obliquely from the evaporation source 310. The area cc is the amount of the intrusion due to the gap between the mother substrate 1000 and the evaporation mask 200. The area of dd is the amount of the masked area due to the gap between the mother substrate 1000 and the evaporation mask 200.

Figure 6:
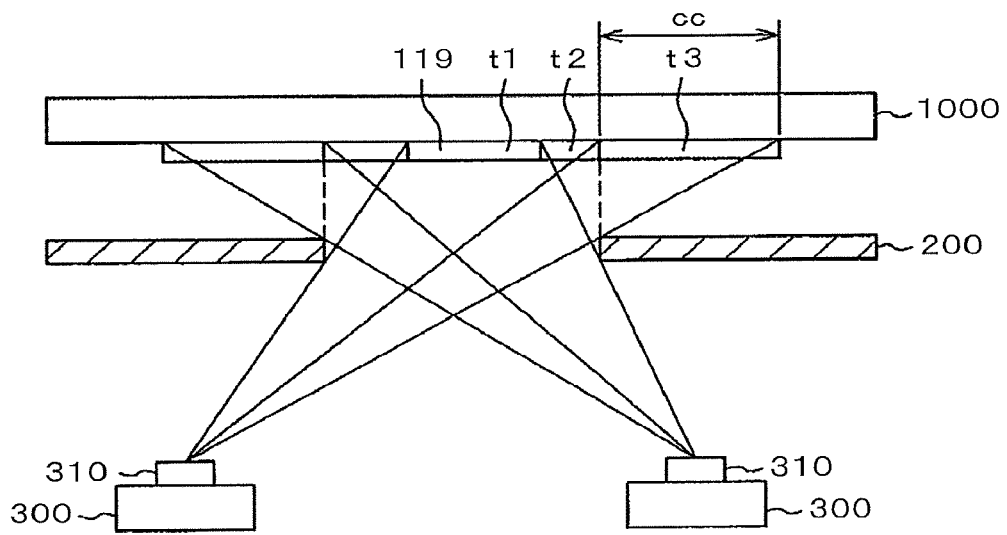
FIG. 6 is a cross sectional view showing another problem in the vacuum evaporation process.

FIG. 6 is a cross sectional view that shows a distribution of a thickness in the organic EL layer when two evaporation sources 310 are used. Due to the intrusion and the masked area explained in FIG. 5, there is a distribution in thickness in the deposited organic EL layer. In FIG. 6, a thickness of the organic EL layer in the area without an influence of the masked area is t1; a thickness of the organic EL layer in the area with an influence of the masked area is t2; a thickness of the organic EL layer due to the intrusion is t3. Each of t1, t2, t3 changes its value in going from a center of the pixel to the periphery of the pixel.

In FIG. 6, the amount of the intrusion cc is specifically a problem. The amount of intrusion cc is determined by a gap between the evaporation mask 200 and the mother substrate 1000 once the position of the evaporation sources 310 and the position of the mother substrate 1000 are fixed. The influence of the intrusion is different according to a pitch of the pixels. Namely, the influence of the intrusion becomes severe when the screen becomes high definition. Colors of light in adjacent pixels are different, and the organic EL materials are different in adjacent pixels; therefore, if an evaporated material reaches to the adjacent pixel, it deteriorates the emitting characteristics and decreases the emitting efficiency of the adjacent pixel. The present invention suppresses the influence of the intrusion.

Returning to FIG. 3, the present invention forms a projection 117 so that a material of the light emitting layer 1192 of the pixel doesn't intrude to the adjacent pixel. A height of the first projection is e.g. 3-5 μm. On the other hand, a precise vacuum evaporation can be made when a gap between the evaporation mask 200 and the bank 116 is small; however, the organic EL material is destroyed when the evaporation mask 200 touches the bank 116. Thus, the present invention forms a second projection as a spacer on the top of the bank 116 so that the gap between the bank 116 and the evaporation mask 200 is determined precisely. A height of the second projection is e.g. 5 μm. The height of the first projection 117 is preferably set about 50-80% of the height of the second projection 118. The first projection and the second projection can be made either by inorganic material like SiO or SiN or by organic material. The height explained above is an example. It is possible to change the height of the first projection 117 or the second projection 118 according to various reasons, e.g., to avoid a disconnection of the upper electrode formed on the first projection 117 and the second projection 118, or to adjust the space that the projections occupy on the top of the bank 116.

Figure 7:
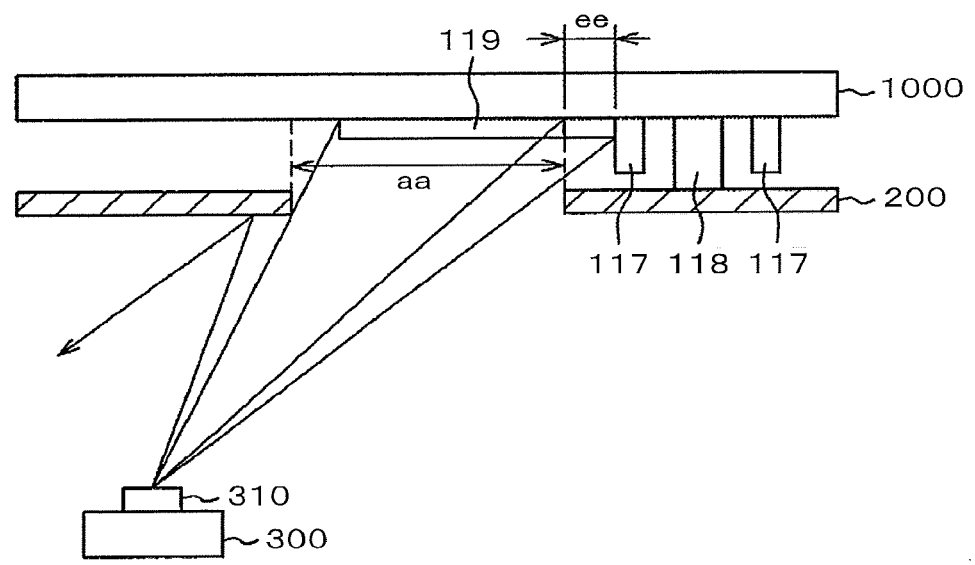
FIG. 7 is a cross sectional view of the vacuum evaporation process according the present invention.

FIG. 7 is a cross sectional view to show the above explained function of the present invention. In FIG. 7, a gap between the mother substrate 1000 and the evaporation mask 200 is determined by the second projection 118. On the other hand, the amount of the intrusion ee of the evaporation material due to the oblique evaporation is determined by the first projection 117. The amount of the intrusion ee in FIG. 7 is less than the amount of the intrusion cc in FIG. 5; thus, an influence to the adjacent pixel is suppressed.

Figure 8:
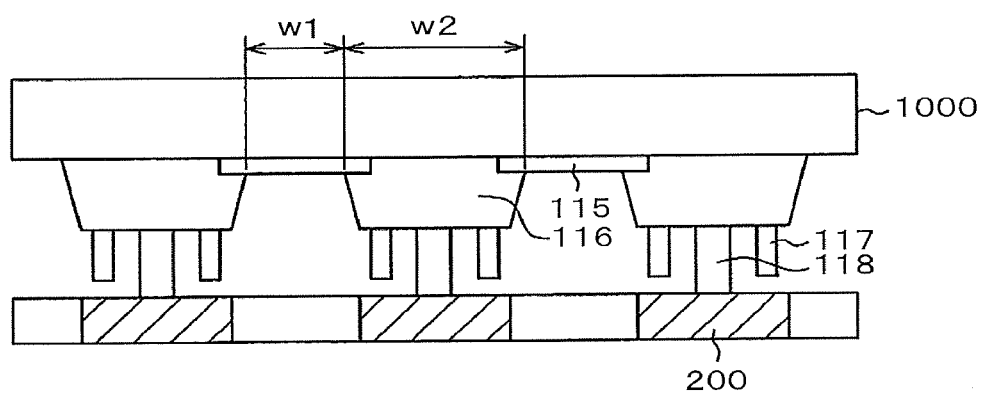
FIG. 8 is a cross sectional view that shows a relation between the first projection, the second projection and the evaporation mask.

FIG. 8 is a cross sectional view that shows a relation between the mother substrate 1000 and the evaporation mask 200. In FIG. 8, layers between the lower electrode 115 and the mother substrate 1000 are omitted. The bank 116 is formed to cover an edge of the lower electrode 115; the first projection 117 and the second projection 118 are formed on the top of the bank 116. The gap between the evaporation mask 200 and the mother substrate 1000 is determined by the second projection 118. When the evaporation material is evaporated through the evaporation mask 200, evaporation area of the organic EL material is determined by the first projection 117.

In FIG. 8, the width of the first projection 117 is narrower than the width of the second projection 118. The height of the first projection 117 is 50-80% of the height of the second projection 118. The height of the second projection 118 is e.g. 5 μm; the height of the first projection 117 is e.g. 3 μm. The height of the first projection 117 and the height of the second projection are defined by their highest value from the top of the bank 116. In the meantime, the height of the first projection 117 and the height of the second projection 118 can also be defined by their highest value from the surface of the TFT substrate 100.

In FIG. 8, the width of the light emitting area, namely, the hole width w1 between the banks 116 is e.g. 20-30 μm; the width w2 of the bank 116 is e.g. 15 μm. FIG. 8 is a drawing for an easy perception, and FIG. 8 doesn't necessarily correspond to the real dimension. In FIG. 8, a width of the opening of the evaporation mask is approximately the same as the width w1 of the hole of the bank 116. In the meantime, the hole width and the bank width correspond to the cross section in lateral direction of FIG. 10.

In FIG. 8, the thickness of the evaporation mask is approximately 20-30 μm. Since evaporation mask 200 must have small openings corresponding to pixels in the organic EL display device, the evaporation mask 200 cannot be thick. In FIG. 8, a tension is applied to keep the evaporation mask 200 flat.

Figure 9A:
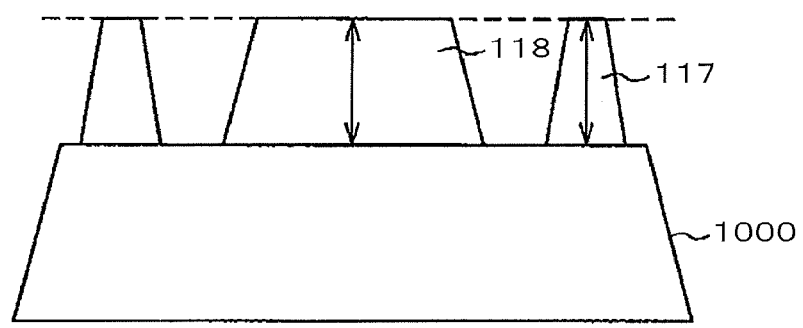
FIG. 9A is a cross sectional view of the first projection and the second projection after pattering.
Figure 9B:
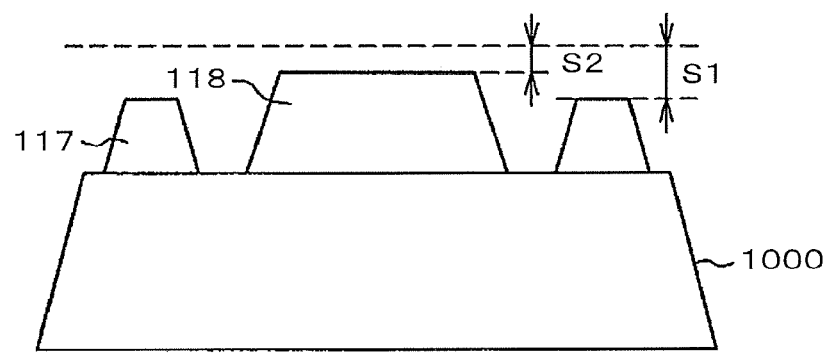
FIG. 9B is a cross sectional view of the first projection and the second projection after baking.

The first projection 117 and the second projection 118 can be made by inorganic material as SiO or SiN, or by organic material like acrylic. FIG. 9A and FIG. 9B are an example that the first projection 117 and the second projection 118 are made by organic material. The feature of FIG. 9A and FIG. 9B is to make a difference in the height between the height of the first projection 117 and the height of the second projection 118 utilizing a difference in width of the first projection 117 and the second projection 118. When the same material is used in the first projection 117 and the second projection 118, the organic material is coated on the display area and patterned.

FIG. 9A shows that the first projection 117 and second projection 118 are patterned. The organic material needs to be baked and hardened. During the baking, the height of the projection becomes lower; the ratio of change of height of the projection is less when the width of the projection is wider as depicted in FIG. 9B. In FIG. 9B, the change of the height of the second projection is S2; the change of the height of the first projection is S1; and S1>S2. Therefore, difference in heights between the first projection 117 and the second projection 118 can be realized without a specific process.

On the other hand, if the first projection 117 and the second projection 118 use the same material as the bank 160, the first projection 117 and the second projection 118 are formed simultaneously with the bank 116. In a coating of an organic material like acrylic for the bank 116, a thickness of the coating material is made as a summation of the thickness of the bank 116 and the height of the first projection 118. Utilizing a half tone exposure technology, the bank 116, the first projection 117 and the second projection 118 can be made in the same lithography. By utilizing the technology explained with FIGS. 9A and 9B, a difference in heights between the first projection and the second projection can be attained.

Figure 10:
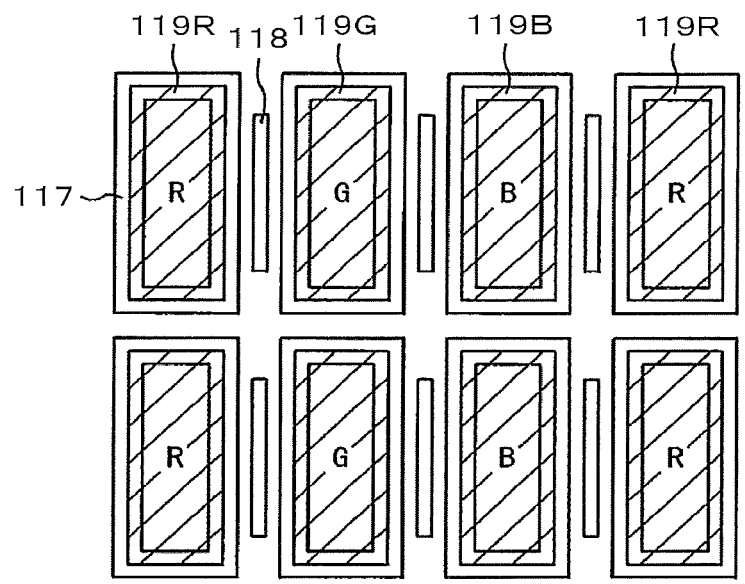
FIG. 10 is a plan view of an example of the first projection and the second projection.

FIG. 10 is a plan view of an example of the first projection 117 and the second projection 118. In FIG. 10, pixels that emit the same color are arranged in longitudinal direction. Each pixel is surrounded by the first projection 117. Thus, the organic EL material is confined in an area surrounded by the first projection 117. In the meantime, the second projection 118 is formed between the pixels. The second projection 118 doesn't surround the pixel because the purpose of the second projection 118 is to determine the gap between the substrate 1000 and the evaporation mask.

Figure 11:
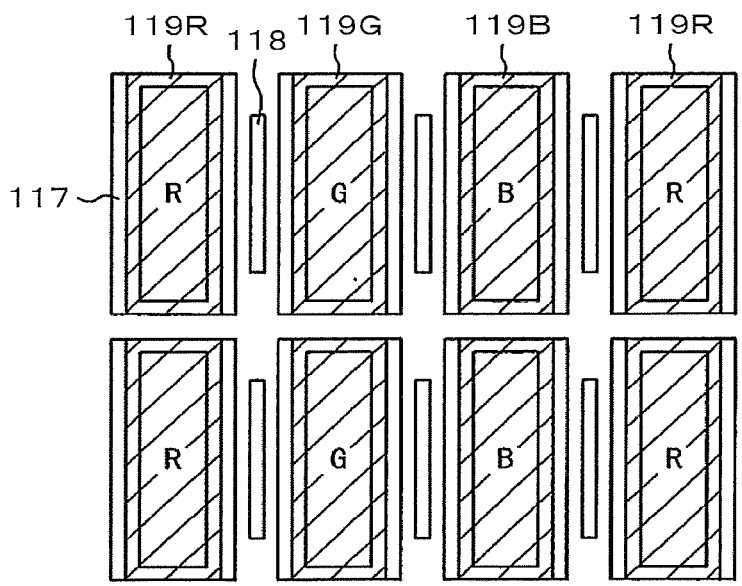
FIG. 11 is a plan view of another example of the first projection and the second projection.

FIG. 11 is a plan view of another example of the first projection 117 and the second projection 118. In FIG. 11, pixels that emit the same color are arranged in longitudinal direction. Since the pixels of the same color are arranged in longitudinal direction, an intrusion of the evaporation material doesn't harm the characteristics of emission in the adjacent pixels in longitudinal direction. Therefore, a part of the first projection 117, which extends in lateral direction and limits the evaporation material in the longitudinal direction, is omitted. The merit of the structure of FIG. 11 is that: even if a disconnection of the upper electrode occurs at the first projection 117, a current can be supplied to the pixel through the area where the first projection is partly eliminated.

Figure 12:
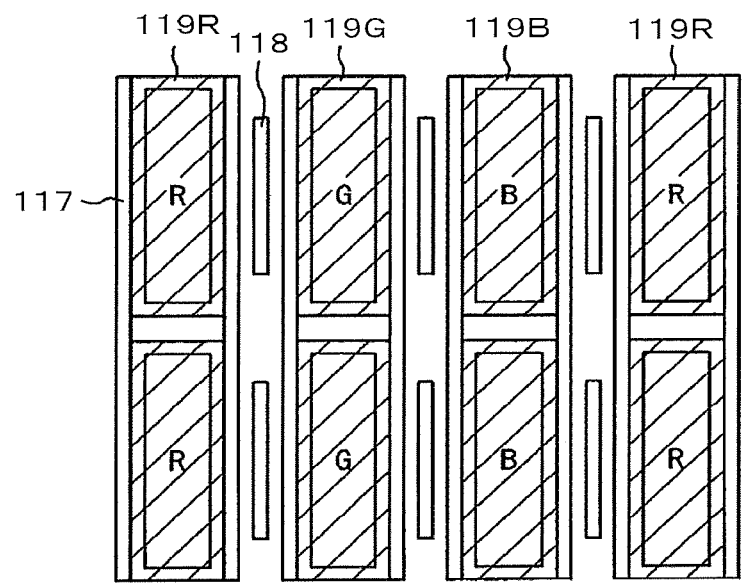
FIG. 12 is a plan view of yet another example of the first projection and the second projection.

FIG. 12 is a plan view of yet another example of the first projection 117 and the second projection 118. In FIG. 12, pixels that emit the same color are arranged in longitudinal direction. FIG. 12 differs from FIG. 11 in that the first projection 117 is continuously formed in a longitudinal direction. When a pixel pitch in a longitudinal direction becomes smaller, it becomes difficult to make patterning for the first projections 117 for individual pixels. In this case, the structure of FIG. 12 becomes reasonable. The effect of FIG. 12 is approximately the same as the effect of FIG. 11.

Figure 13:
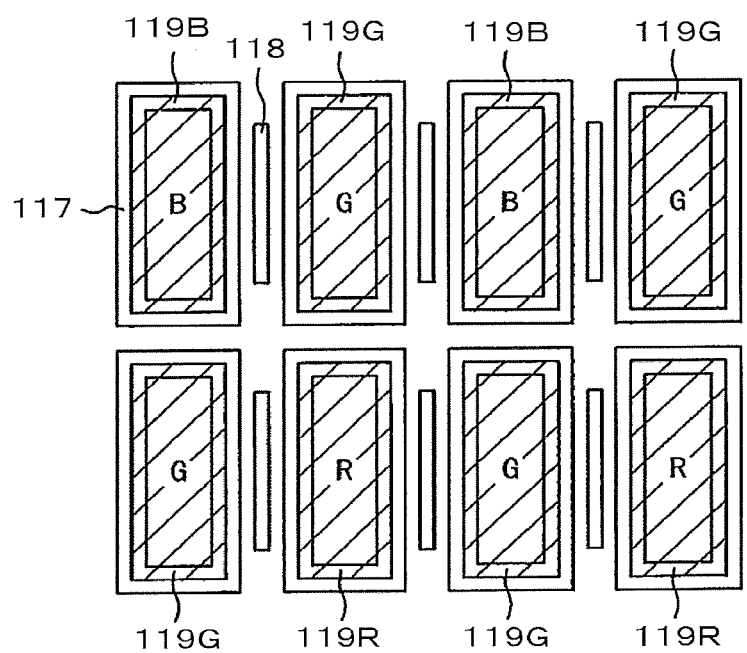
FIG. 13 is a plan view of yet another example of the first projection and the second projection.

FIG. 13 is a plan view of yet another example of the first projection 117 and the second projection 118. In FIG. 13, pixels that emit different colors are alternatively arranged in longitudinal direction. The plan views of the first projection 117 and the second projection 118 of FIG. 13 are the same as the plan views of the first projection 117 and the second projection 118 of FIG. 10. Namely, each pixel is surrounded by the first projection 117. Thus, the organic EL material is confined in an area surrounded by the first projection 117. In the meantime, the second projection 118 is formed between the pixels. The second projection doesn't surround the pixel because the purpose of the second projection 118 is to determine the gap between the substrate 1000 and the evaporation mask.

Figure 14:
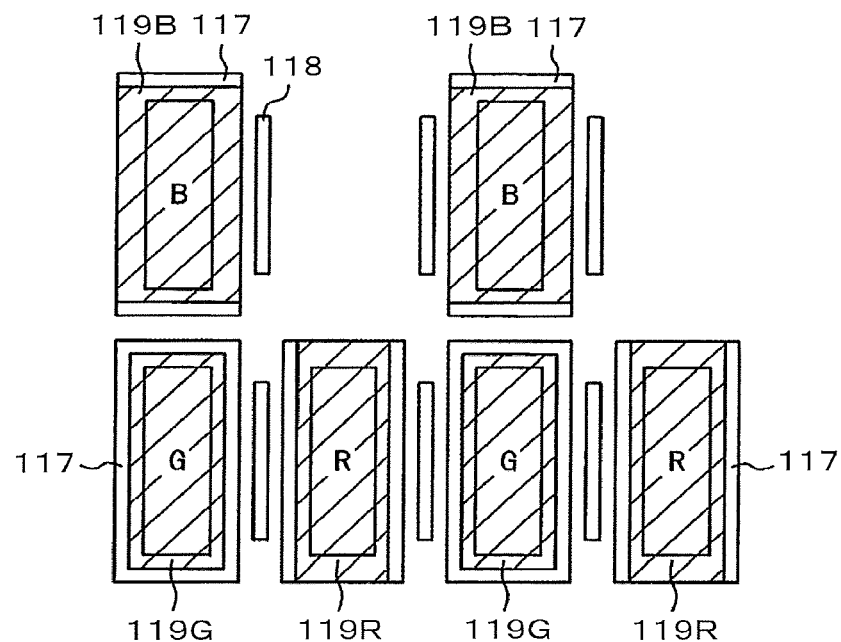
FIG. 14 is a plan view of yet another example of the first projection and the second projection.

FIG. 14 is a plan view of yet another example of the first projection 117 and the second projection 118. In FIG. 14, pixels that emit different colors are alternatively arranged in longitudinal direction and in lateral direction, however, there are areas no pixels are formed. The second projections 118 of FIG. 14 are the same as the second projections 118 of FIG. 13. However, a part of the first projection 117 doesn't exist at the boundary with the place where no pixel exists. It is because if there is no pixel, the problem of intrusion doesn't occur.

Figure 15:
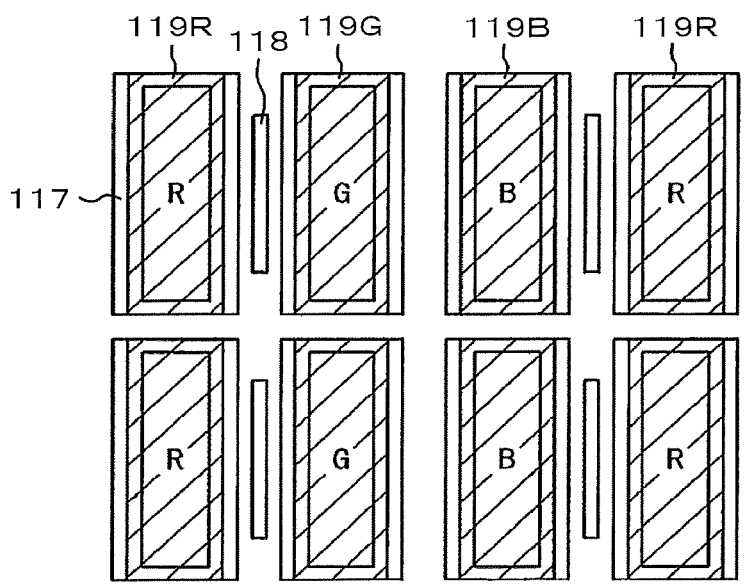
FIG. 15 is a plan view of yet another example of the first projection and the second projection.

FIG. 15 is a plan view of yet another example of the first projection 117 and the second projection 118. In FIG. 15, the second projection 118 doesn't exist in every bank 116; however, it exists in every other pixel. In FIG. 15, for example, the second projection 118 doesn't exist between the green pixel and the blue pixel. A role of the second projection is to determine the gap between the mother substrate 1000 and the evaporation mask 200, thus, the second projection 118 is not necessary for all the pixels as far as the gap can be maintained properly.

FIG. 15 is an example that the second projection is set every other pixel, however, the extraction of the second projections cam be every two other pixels or more. Further, the extraction of the second projection is made in lateral direction in FIG. 15; however, the extraction can be made in longitudinal direction. The reason is the same as the extraction is made in lateral direction.

Figure 16:
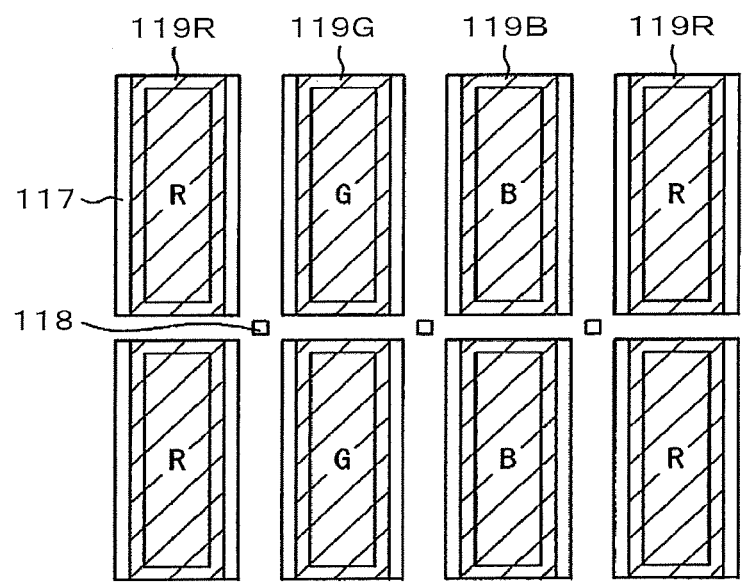
FIG. 16 is a plan view of yet another example of the first projection and the second projection.

FIG. 16 is a plan view of yet another example of the first projection 117 and the second projection 118. In FIG. 16, the shape of the first projection is the same as FIG. 11. The feature of FIG. 16 is that: the second projection 118 is not line shaped but is island shaped. Further, the second projection 118 is set at the area where the bank 116 extending in lateral direction and the bank 116 extending in longitudinal direction cross each other.

Sometimes it is difficult to save a space for two first projections and a second projection on the top of the bank 116. Even in this case, there is usually a space at the area where the bank 116, extending in lateral direction, and the bank 116, extending in longitudinal direction, cross each other. Therefore, the second projection can be set at this area to determine the gap between the substrate 1000 and the evaporation mask 200. In the meantime, the island shaped second projection need not be set at all the cross point areas, but can be extracted as far as the gap between the substrate 1000 and the evaporation mask can be maintained properly.

Second Embodiment

Figure 17:
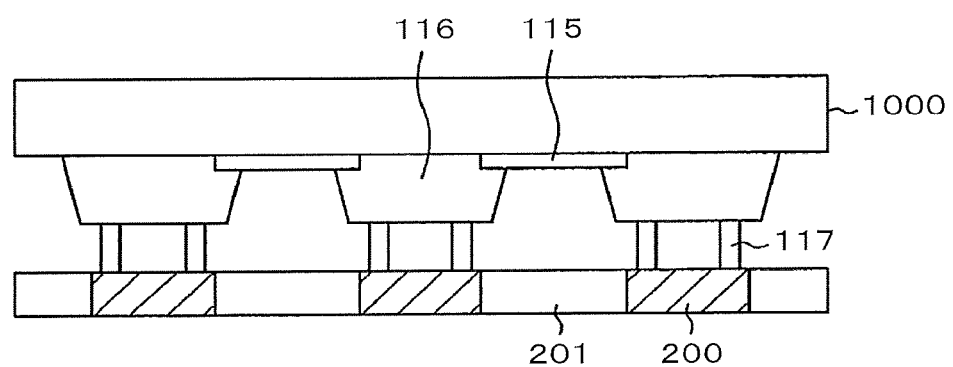
FIG. 17 is a cross sectional view that shows an example of a relation between the first projection and the evaporation mask according to embodiment 2.

FIG. 17 is a cross sectional view of the second embodiment. The structure of FIG. 17 is the same as the structure of FIG. 8 except the projections formed on the top of the bank 116. In FIG. 17, unlike the first embodiment, two first projections 117 exist on the top of the bank 116; however, the second projection doesn't exist. The gap between the substrate 1000 and the evaporation mask 200 is determined by the first projection 117.

In FIG. 17, too, the area of the organic EL layer is defined by the first projection 117 as in the first embodiment. In the second embodiment, too, the electron injection layer and the electron transport layer are formed in common in all the display area. The hole injection layer and the hole transport layer can be formed in individual pixels defined by the first projection as the case for the organic EL material. Alternatively, the hole injection layer and the hole transport layer can be formed in common in all the display area.

The structure of FIG. 17 is specifically effective when the top of the bank 116 cannot provide enough space for projections due to high definition display, where the pixel pitch is small. In FIG. 17, the first projection 117 determines the gap between the substrate 100 and the evaporation mask 200, thus, the height of the first projection is preferably as high as 5 μm. In the second embodiment, too, the first projection 117 can be made by inorganic material as SiO or SiN, or can be made by organic material like acrylic. If the first projection 117 can be made by the same material as the bank 116, the first projections 117 and the bank 116 can be simultaneously formed by using a half tone exposure technology.

Figure 18:
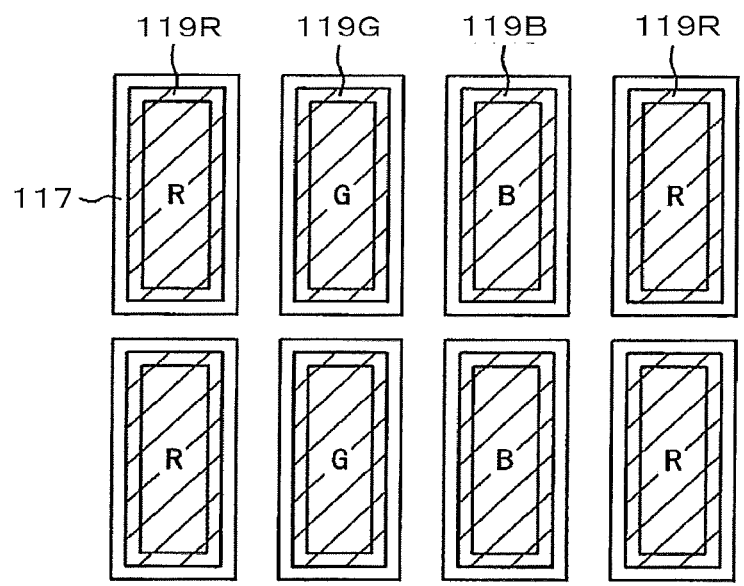
FIG. 18 is a plan view of an example of the first projection according to embodiment 2.

FIG. 18 is a plan view of an example of the first projection 117 according to the second embodiment. In FIG. 18, pixels that emit the same color are arranged in longitudinal direction. FIG. 18 is the same as FIG. 10 of the first embodiment except the second projection doesn't exist.

Figure 19:
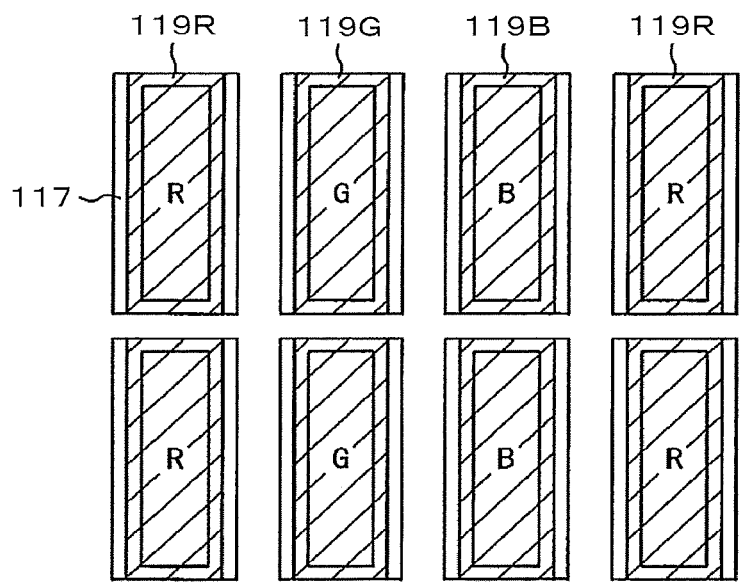
FIG. 19 is a plan view of another example of the first projection according to embodiment 2.

FIG. 19 is a plan view of another example of the first projection 117 according to the second embodiment. In FIG. 19, pixels that emit the same color are arranged in longitudinal direction. FIG. 19 is the same as FIG. 11 of the first embodiment except the second projection doesn't exist.

Figure 20:
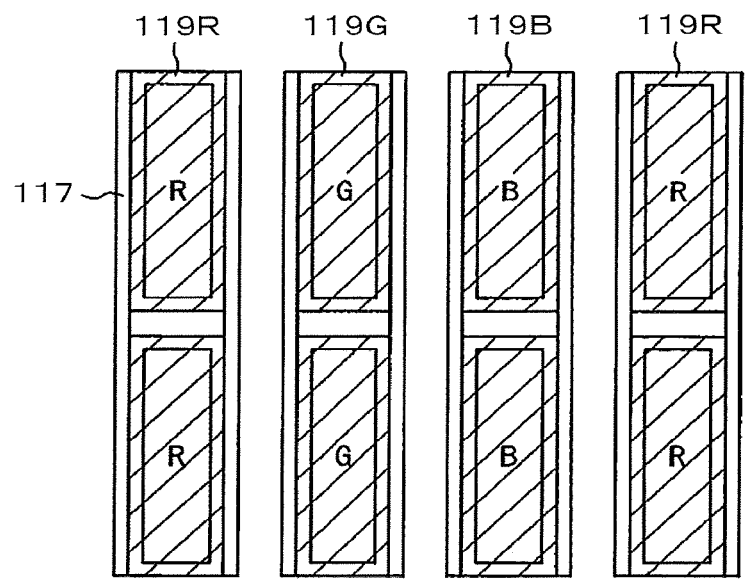
FIG. 20 is a plan view of yet another example of the first projection according to embodiment 2.

FIG. 20 is a plan view of yet another example of the first projection 117 according to the second embodiment. In FIG. 20, pixels that emit the same color are arranged in longitudinal direction. FIG. 20 is the same as FIG. 12 of the first embodiment except the second projection doesn't exist.

Figure 21:
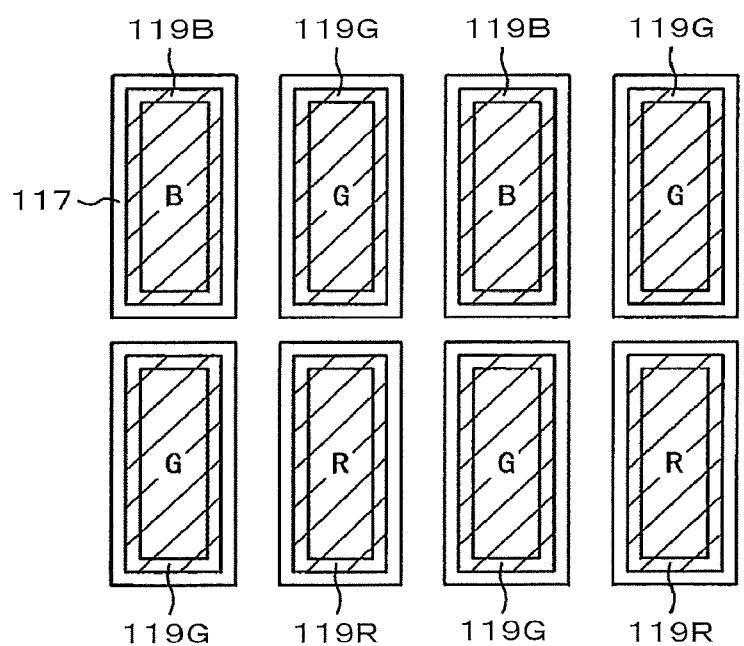
FIG. 21 is a plan view of yet another example of the first projection according to embodiment 2.

FIG. 21 is a plan view of yet another example of the first projection 117 according to the second embodiment. In FIG. 21, pixels that emit different colors are alternatively arranged in longitudinal direction and in lateral direction. FIG. 21 is the same as FIG. 13 of the first embodiment except the second projection doesn't exist.

Figure 22:
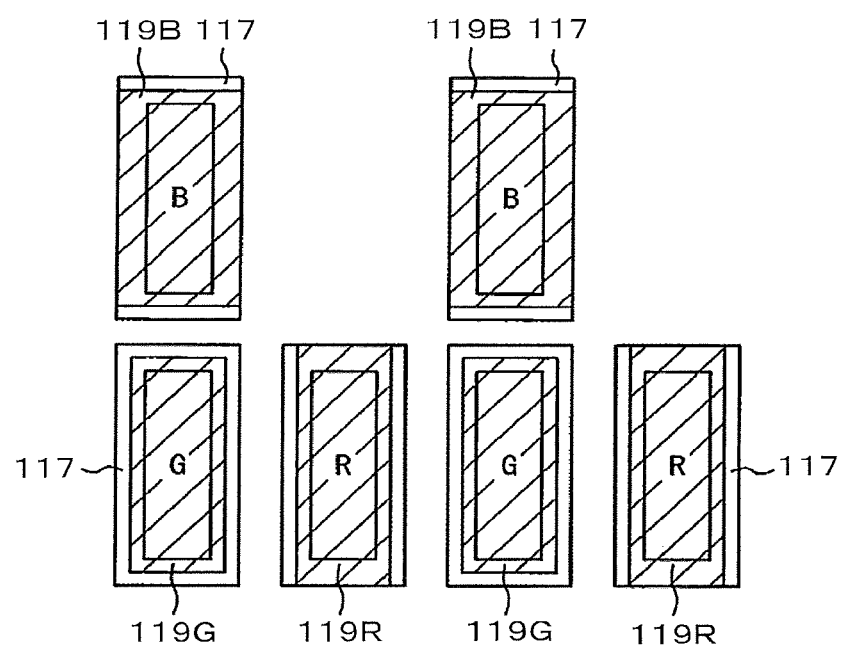
FIG. 22 is a plan view of yet another example of the first projection according to embodiment 2.

FIG. 22 is a plan view of yet another example of the first projection 117 according to the second embodiment. In FIG. 22, pixels that emit different colors are alternatively arranged in longitudinal direction and in lateral direction, however, there are areas no pixels are formed. FIG. 22 is the same as FIG. 14 of the first embodiment except the second projection doesn't exist.

The first embodiment shows that two first projections and one second projection are formed on the top of the bank 116; the second embodiment shows that two first projections are formed on the top of the bank 116. Numbers of first projection and the second projection are not limited in those examples. More first projections or more second projections can be formed if the space allows in the first embodiment. In the second embodiment, if the space of the top of the bank allows, three or more of the first projections can be formed.

As described above, according to the present invention, in an organic EL display device, where organic EL layers of different emitting colors are formed in individual pixels, an area of the evaporated organic EL material can be precisely determined, thus, an organic EL display device of high quality image can be realized with high production yield.

What is claimed is:

1. A display device comprising:
pixel electrodes are formed in a matrix arrangement on a substrate and a space exists between the pixel electrodes,
a bank, which covers an edge of the pixel electrodes, having an opening that exposes a part of one of the pixel electrodes,
a first projection formed on a top of the bank and along a side of the opening,
a second projection formed in an area that is near to the center of the top of the bank than the first projection is, in a plan view.

2. The display device according to claim 1,
wherein a second distance between a top of the second projection and a surface of the substrate is bigger than a first distance between the top of the first projection and the surface of the substrate.

3. The display device according to claim 1,
wherein the second projection is set between adjacently located two first projections.

4. The display device according to claim 1,
a first organic layer, which emits light of a first wave length, on one of the pixel electrodes,
a second organic layer, which emits light of a second wave length, on another of the pixel electrodes,
the one of the pixel electrode and the another of the pixel electrode are adjacently located, wherein two first projections are formed between the one of the pixel electrodes and the another of the pixel electrodes.

5. The display device according to claim 4, wherein the second projection is set between the two first projections.

6. The display device according to claim 1, wherein the first projection surrounds the opening.

7. The display device according to claim 1, wherein a length of a side of the first projection along the side of the opening is longer than a length of the side of the opening.

8. The display device according to claim 1, wherein organic EL layers are formed on the pixel electrodes,
an upper electrode is formed on the organic EL layers,
the upper electrode covers the first projection and the second projection.

9. The display device according to claim 8, wherein the first projection and the second projection are covered by a protective layer.

10. A display device comprising:
pixel electrodes are formed in a matrix arrangement on a substrate and a space exists between the pixel electrodes,
a bank, which covers an edge of the pixel electrodes, having an opening that exposes a part of one of the pixel electrodes,
first projections formed on a top of the bank and along a side of the opening,
wherein two first projections are formed between one of the pixel electrodes and an adjacently located another of the pixel electrodes.

11. The display device according to claim 10, wherein the first projections surround the opening.

12. The display device according to claim 10, wherein a length of a side of one of the first projections along the side of the opening is longer than a length of the side of the opening.

13. The display device according to claim 10, wherein a second projection is set between the two first projections.

14. The display device according to claim 13, wherein a second distance between a top of the second projection and a surface of the substrate is bigger than a first distance between the top of one of the first projections and the surface of the substrate.

15. The display device according to claim 13, wherein organic EL layers are formed on the pixel electrodes,
an upper electrode is formed on the organic EL layers,
the upper electrode covers the first projections and the second projection.

16. The display device according to claim 15, wherein the first projections and the second projection are covered by a protective layer.

* * * * *